(12) United States Patent
Nakafuji et al.

(10) Patent No.: US 9,091,922 B2
(45) Date of Patent: Jul. 28, 2015

(54) RESIN COMPOSITION, RESIST UNDERLAYER FILM, RESIST UNDERLAYER FILM-FORMING METHOD AND PATTERN-FORMING METHOD

(71) Applicant: JSR CORPORATION, Tokyo (JP)

(72) Inventors: Shin-ya Nakafuji, Tokyo (JP); Satoru Murakami, Tokyo (JP); Kazuhiko Koumura, Tokyo (JP); Yuushi Matsumura, Tokyo (JP); Masayuki Motonari, Tokyo (JP); Katsuhisa Mizoguchi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 13/714,406

(22) Filed: Dec. 14, 2012

(65) Prior Publication Data

US 2013/0153535 A1 Jun. 20, 2013
US 2014/0014620 A9 Jan. 16, 2014

(30) Foreign Application Priority Data

Dec. 16, 2011 (JP) .................................. 2011-275809
Nov. 30, 2012 (JP) .................................. 2012-263224

(51) Int. Cl.
*G03F 7/11* (2006.01)
*G03F 7/09* (2006.01)
*H01L 21/027* (2006.01)

(52) U.S. Cl.
CPC *G03F 7/11* (2013.01); *G03F 7/091* (2013.01); *H01L 21/0276* (2013.01)

(58) Field of Classification Search
None
See application file for complete search history.

(56) References Cited

U.S. PATENT DOCUMENTS

| 6,165,684 | A * | 12/2000 | Mizutani et al. ........... 430/271.1 |
| 7,582,896 | B2 * | 9/2009 | Halik et al. ..................... 257/40 |
| 2012/0181251 | A1 * | 7/2012 | Minegishi et al. .............. 216/49 |

FOREIGN PATENT DOCUMENTS

| JP | 05-238990 | | 9/1993 |
| JP | 2000-143937 | | 5/2000 |
| JP | 2001-040293 | | 2/2001 |
| JP | 2002-296789 | | 10/2002 |
| JP | 2004-168748 | | 6/2004 |
| JP | 2011-170059 | A * | 9/2011 |
| WO | WO-2011/040340 | A1 * | 4/2011 |

OTHER PUBLICATIONS

English translation of JP, 2011-170059, A (2011) from machine translation from AIPN Japan Patent Office National Center for Industrial Property Information and Training, generated Apr. 3, 2013, 31 pages.*
Qun-Sheng Guo et al.,"A facile synthesis of 3 or 3,3'-substituted binaphthols and their applications in the asymmetric addition of diethylzinc to aldehydes", Journal of Organometallic Chemistry, 2006, vol. 691, No. 6, p. 1282-1287.
Badar et al., "Optical Activity in the 1,1'-Binaphthyl Series", Journal of the Chemical Society, 1965, p. 1412-1418.
Jen-Chieh Hsieh et al., "O-Dihaloarenes as aryne precursors for nickel-catalyzed [2 + 2 + 2] cycloaddition with alkynes and nitriles", Chemical Communications (Cambridge, United Kingdom), 2008, No. 26, p. 2992-2994.
Bacon et al., "Cyclisations with Hydrazine. Part III, Syntheses of Pentaphene and Dinaphtho [2,1-d : 1',2'-f][1,2] diazocine", Journal of the Chemical Society, 1963, p. 839-845.
Mizoguchi et al., "Negative-Working Photosensitive Poly(phenylene ether) Based on Poly(2,6-dimethyl-1,4-phenylene ether), a Cross-Linker, and a Photoacid Generator", Macromolecules, 2010, vol. 43, p. 2832-2839.
Mizoguchi et al., "Direct Patterning of Poly(ether ether sulfone) Using a Cross-linker and a Photoacid Generator", Polymer Journal, 2008, vol. 40, No. 7, p. 645-650.
Mizoguchi et al., "Negative-Type Photosensitive Poly(phenylene ether) Based on Poly(2,6-dimethyl-1,4-phenylene ether), a Crosslinker, and a Photoacid Generator", Journal of Polymer Science: Part A, Polymer Chemistry, 2008, vol. 46, p. 4949-4958.

* cited by examiner

*Primary Examiner* — Cynthia Hamilton
(74) *Attorney, Agent, or Firm* — Oblon, McClelland, Maier & Neustadt, L.L.P.

(57) ABSTRACT

A resin composition for forming a resist underlayer film includes a resin that includes an aromatic ring, and a crosslinking agent having a partial structure represented by a following formula (i). X represents an oxygen atom, a sulfur atom, *—COO— or —NR$^A$—. R$^1$ represents a hydrogen atom or a C$_{1-30}$ monovalent hydrocarbon group. R$^2$ represents a hydroxy group, a sulfanil group, a cyano group, a nitro group, a C$_{1-30}$ monovalent hydrocarbon group, a C$_{1-30}$ monovalent oxyhydrocarbon group or a C$_{1-30}$ monovalent sulfanilhydrocarbon group. p is an integer of 1 to 3.

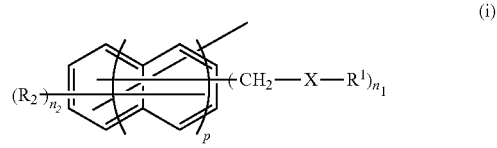

(i)

24 Claims, No Drawings

RESIN COMPOSITION, RESIST UNDERLAYER FILM, RESIST UNDERLAYER FILM-FORMING METHOD AND PATTERN-FORMING METHOD

CROSS-REFERENCE TO RELATED APPLICATIONS

The present application claims priority under 35 U.S.C. §119 to Japanese Patent Application No. 2011-275809, filed Dec. 16, 2011, and to Japanese Patent Application No. 2012-263224, filed Nov. 30, 2012. The contents of these applications are incorporated herein by reference in their entirety.

BACKGROUND OF THE INVENTION

1. Field of the Invention

The present invention relates to a resin composition, a resist underlayer film, a resist underlayer film-forming method, and a pattern-forming method.

2. Discussion of the Background

In manufacturing methods of integrated circuit elements, miniaturization of processing size using a multilayer resist process has progressed in order to achieve a higher degree of integration. In this process, a liquid resin composition for forming a resist underlayer film is first coated on a substrate, and thereafter a liquid photoresist composition is further coated. Next, a mask pattern is transferred using a reduced projection exposure system (stepper) and developed with an appropriate developer solution to obtain a resist pattern. Subsequently, the resist pattern is transferred to the resist underlayer film by dry etching. Finally, the resist underlayer film pattern is transferred to the substrate by dry etching, whereby a substrate provided with a desired pattern can be obtained. In this process, a multilayer process in which one type of a resist underlayer film is used may be referred to as "two-layer resist process", whereas a multilayer process in which two types of resist underlayer films are used may be referred to as "three-layer resist process".

In general, resist underlayer films have a function as an antireflective film that absorbs radioactive rays reflected from the substrate. Also, a material having a high carbon content is generally used for resist underlayer films positioned immediately on the substrate. When the carbon content is high, etching selectivity upon processing of the substrate is improved, and thus more accurate pattern transfer is enabled. As such underlayer films, in particular, thermosetting phenol novolak resins have been well known. In addition, it is known that compositions containing an acenaphthylene polymer exhibit favorable characteristics as an underlayer film (see Japanese Unexamined Patent Application, Publication Nos. 2000-143937 and 2001-40293).

SUMMARY OF THE INVENTION

According to one aspect of the present invention, a resin composition for forming a resist underlayer film includes a resin that includes an aromatic ring, and a crosslinking agent having a partial structure represented by a following formula (i).

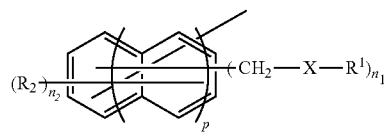

In the formula (i), X represents an oxygen atom, a sulfur atom, *—COO— or —NR$^A$—, wherein R$^A$ represents a hydrogen atom or a monovalent hydrocarbon group having 1 to 30 carbon atoms, and * denotes a site bonded to R$^1$. R$^1$ represents a hydrogen atom or a monovalent hydrocarbon group having 1 to 30 carbon atoms. R$^2$ represents a hydroxy group, a sulfanil group, a cyano group, a nitro group, a monovalent hydrocarbon group having 1 to 30 carbon atoms, a monovalent oxyhydrocarbon group having 1 to 30 carbon atoms or a monovalent sulfanilhydrocarbon group having 1 to 30 carbon atoms. $n_1$ is an integer of 1 to 12. $n_2$ is an integer of 0 to 11, wherein a sum of $n_1$ and $n_2$ is an integer of no greater than 12, and in a case in which at least one of X, R$^1$ and R$^2$ is present in plural number, each of the plural Xs, the plural R$^1$s and the plural R$^2$s are a same or different. p is an integer of 1 to 3.

According to another aspect of the present invention, a resist underlayer film is formed from the resin composition.

According to further aspect of the present invention, a resist underlayer film-forming method includes providing a coating film using the resin composition, and heating the coating film.

According to further aspect of the present invention, a pattern-forming method includes providing a resist underlayer film on an upper face side of a substrate using the resin composition. A resist film is provided on an upper face side of the resist underlayer film using a resist composition. The resist film is exposed. The exposed resist film is developed to form a resist pattern. The resist underlayer film and the substrate are sequentially dry etched using the resist pattern as a mask.

DESCRIPTION OF THE EMBODIMENTS

Embodiments of the present invention are as set forth in the followings.

An embodiment of the invention provides a resin composition for forming a resist underlayer film containing a resin that includes an aromatic ring, and a crosslinking agent having a partial structure represented by the following formula (i).

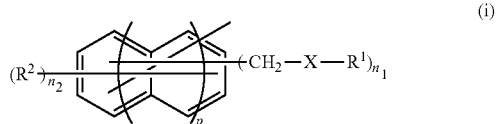

In the formula (i), X represents an oxygen atom, a sulfur atom, *—COO— or —NR$^A$—, wherein R$^A$ represents a hydrogen atom or a monovalent hydrocarbon group having 1 to 30 carbon atoms, and * denotes a site bonded to R$^1$; R$^1$ represents a hydrogen atom or a monovalent hydrocarbon group having 1 to 30 carbon atoms; R$^2$ represents a hydroxy group, a sulfanil group, a cyano group, a nitro group, a monovalent hydrocarbon group having 1 to 30 carbon atoms, a monovalent oxyhydrocarbon group having 1 to 30 carbon atoms or a monovalent sulfanilhydrocarbon group having 1 to 30 carbon atoms; $n_1$ is an integer of 1 to 12; $n_2$ is an integer of 0 to 11, wherein the sum of $n_1$ and $n_2$ (i.e., ($n_1+n_2$)) is an integer of no greater than 12, and in the case in which X, $R^1$ and $R^2$ are each present in plural number, the plural Xs, $R^1$s and $R^2$s may be the same or different; and p is an integer of 1 to 3.

Another embodiment of the invention provides a resist underlayer film formed from the resin composition for forming a resist underlayer film.

Another embodiment of the invention provides a method for forming a resist underlayer film, the method including the steps of: providing a coating film using the resin composition for forming a resist underlayer film, and heating the coating film.

Another embodiment of the invention provides a pattern-forming method, the method including the steps of:

providing a resist underlayer film on the upper face side of a substrate using the resin composition for forming a resist underlayer film;

providing a resist film on the upper face side of the resist underlayer film using a resist composition;

exposing the resist film;

forming a resist pattern by developing the exposed resist film; and sequentially dry etching the resist underlayer film and the substrate using the resist pattern as a mask.

The embodiments of the present invention provide a resin composition for forming a resist underlayer film that is characterized by involving oxidative crosslinking by a dehydrogenation reaction in steps of forming an underlayer film for resists, and that is suitable for the microfabrication in lithography processes in which various types of radioactive rays are used, particularly for the manufacture of highly integrated circuit elements, and further provide a resist underlayer film, a formation method thereof and a pattern-forming method.

According to the resin composition for forming a resist underlayer film of the embodiment of the present invention, a resist underlayer film can be formed having a function as an antireflective film, and being superior in pattern transfer performances and etching resistance.

Specifically, the resist underlayer film of one embodiment of the present invention is superior in etching resistance, and even if a pattern to be transferred is fine, the underlayer film pattern is less likely to be bent when the substrate to be processed is etched. Therefore, the resist underlayer film will have accurate pattern transfer performances and favorable etching selectivity in a dry etching process, accompanied by less overetching of the resist underlayer film, whereby the resist pattern can be transferred with good reproducibility and fidelity to the substrate to be processed. In addition, since the underlayer film pattern is less likely to be bent when the substrate to be processed is etched, improvement of yields in microfabrication in lithography processes, particularly in manufacture of highly integrated circuit elements can be expected. Moreover, since the resist underlayer film of the embodiment of the present invention is particularly superior in functions as an antireflective film, favorable pattern configuration of the resist film formed on the upper face side can be provided.

Furthermore, according to another embodiment of the method for forming a resist underlayer film of the present invention, using the resin composition for forming a resist underlayer film, a resist underlayer film that is superior in etching resistance, and is less likely to be accompanied by bending of the underlayer film pattern in etching of a substrate to be processed can be readily formed on the substrate to be processed.

Additionally, according to yet another embodiment of the pattern-forming method of the present invention, a resist pattern can be transferred to a substrate to be processed with good reproducibility and fidelity.

Hereinafter, embodiments of the present invention will be explained in detail.

(1) Resin Composition for Forming Resist Underlayer Film

The resin composition for forming a resist underlayer film according to an embodiment of the present invention contains a resin that includes an aromatic ring, and a crosslinking agent having a specified structure.

[Resin that Includes an Aromatic Ring]

The resin that includes an aromatic ring (hereinafter, may be also referred to as "resin (A)") is not particularly limited as long as it is a resin that includes an aromatic ring, and examples thereof include a novolak resin, a resol resin, an acenaphthylene resin, a styrene resin, a polyarylene resin, and the like.

Specific examples of the novolak resin include resins obtained by allowing one or at least two types of phenolic compounds selected from the group consisting of phenols such as phenol, cresol, xylenol, resorcinol, bisphenol A, para-tertiary butyl phenol, paraoctyl phenol, 9,9-bis(4-hydroxyphenyl)fluorene, 9,9-bis(4-hydroxyphenyl)fluorene and 9,9-bis(4-hydroxynaphthalene)fluorene, and naphthols such as α-naphthol, β-naphthol, 1,5-dihydroxynaphthalene and 2,7-dihydroxynaphthalene to react with one or at least two types of aldehyde sources such as formaldehyde, paraformaldehyde and trioxane using an acidic catalyst, and the like.

Such a resin is exemplified by a resin having a structural unit represented by the following formula (a1), and the like.

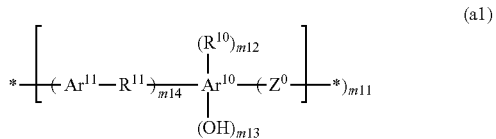

(a1)

In the above formula (a1), $Ar^{10}$ represents an aromatic group having a valency of (m11+m12+m13+1).

$R^{10}$ represents a monovalent hydrocarbon group having 1 to 10 carbon atoms, or a monovalent group obtained by combining this hydrocarbon group with at least one selected from the group consisting of —CO—, —COO—, —OCO—, —O—, —CS—, —S—, —SO—, —SO$_2$— and —NR$^D$—, wherein $R^D$ represents a hydrogen atom or a monovalent hydrocarbon group having 1 to 10 carbon atoms.

$R^{11}$ and $Z^0$ each independently represent a single bond, a bivalent hydrocarbon group having 1 to 10 carbon atoms, —CO—, —COO—, —OCO—, —O—, —CS—, —S—, —SO—, —SO$_2$— or —NR$^E$—, or a bivalent group obtained by combining these groups, wherein $R^E$ represents a hydrogen atom or a monovalent hydrocarbon group having 1 to 10 carbon atoms.

m11 represents the number of $Z^0$ bonded to $Ar^{10}$ and is an integer of 1 to 6; m12 is an integer of 0 to 6; m13 is an integer of 0 to 6; m14 is an integer of 0 to 2, and in the case in which $R^{10}$, $R^{11}$, $Ar^{11}$ and $Z^0$ are each present in plural number, the plural $R^{10}$s, $R^{11}$s, $Ar^{11}$s and $Z^0$s may be the same or different, and * denotes a bonding hand.

It is to be noted that $R^{10}$ and $R^{11}$ in the formula (a1) may have a substituent. The substituent is exemplified by a halogen atom, a hydroxy group, and the like. Examples of the halogen atom include fluorine, chlorine, bromine, iodine, and the like.

The monovalent hydrocarbon group having 1 to 10 carbon atoms represented by the $R^{10}$ is exemplified by a linear or branched monovalent chain hydrocarbon group having 1 to 10 carbon atoms, a monovalent alicyclic hydrocarbon group having 3 to 10 carbon atoms, a monovalent aromatic hydrocarbon group having 6 to 10 carbon atoms, or a group obtained by combining these groups, and the like.

Examples of the linear or branched monovalent chain hydrocarbon group having 1 to 10 carbon atoms include a methyl group, an ethyl group, a n-propyl group, an i-propyl group, a n-butyl group, a 2-methylpropyl group, a 1-methylpropyl group, a t-butyl group, a pentyl group, a hexyl group, an octyl group, a dodecyl group, and the like.

Examples of the monovalent alicyclic hydrocarbon group having 3 to 10 carbon atoms include a cyclopropyl group, a cyclobutyl group, a cyclopentyl group, a cyclohexyl group, a cyclooctyl group, a cyclododecyl group, and the like.

Examples of the monovalent aromatic hydrocarbon group having 6 to 10 carbon atoms include a phenyl group, a tolyl group, a naphthyl group, and the like.

The monovalent group obtained by combining the hydrocarbon group represented by the $R^{10}$ with at least one selected from the group consisting of —CO—, —COO—, —OCO—, —O—, —CS—, —S—, —SO—, —SO$_2$— and —NR$^D$— is exemplified by an alkoxy group having 1 to 10 carbon atoms, an alkoxycarbonyl group having 2 to 10 carbon atoms, a glycidyl ether group, an alkylglycidyl ether group (wherein, the alkyl moiety has 1 to 10 carbon atoms), and the like.

The bivalent hydrocarbon group having 1 to 10 carbon atoms represented by the $R^{11}$ and $Z^0$ is exemplified by a linear or branched bivalent chain hydrocarbon group having 1 to 10 carbon atoms, a bivalent alicyclic hydrocarbon group having 3 to 10 carbon atoms, a bivalent aromatic hydrocarbon group having 6 to 10 carbon atoms, or a group obtained by combining these groups, and the like.

The linear or branched bivalent chain hydrocarbon group having 1 to 10 carbon atoms is preferably a linear or branched alkylene group having 2 to 8 carbon atoms, and examples include an ethylene group, a propylene group, a butylene group, a hexylene group, an octylene group, and the like.

The bivalent alicyclic hydrocarbon group having 3 to 10 carbon atoms is preferably an alicyclic hydrocarbon group having 5 to 12 carbon atoms, and examples thereof include monocyclic alicyclic hydrocarbon groups such as a cyclopentylene group and a cyclohexylene group; groups derived by removing two hydrogen atoms from a polycyclic hydrocarbon such as norbornane or adamantane, and the like.

Examples of the bivalent aromatic hydrocarbon group having 6 to 10 carbon atoms include a phenylene group, a tolylene group, a naphthylene group, and the like.

Examples of the aromatic group having a valency of (m11+m12+m13+1) represented by the $Ar^{10}$ include groups derived by removing (m11+m12+m13+1) hydrogen atoms from a benzene type aromatic ring such as a benzene ring, a naphthalene ring, an anthracene ring, an indene ring or a fluorenylidene biphenyl ring, heterocyclic aromatic rings such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring and a triazine ring, and the like.

Examples of the bivalent aromatic group represented by the $Ar^{11}$ include groups derived by removing two hydrogen atoms from a benzene type aromatic ring such as a benzene ring, a naphthalene ring, an anthracene ring, an indene ring and a fluorenylidene biphenyl ring, heterocyclic aromatic rings such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring and a triazine ring, and the like.

Specific examples of the resol resin include resins obtained by allowing the phenolic compound described above to react with the aforementioned aldehyde source using an alkaline catalyst, and the like.

Examples of the acenaphthylene resin include resins that include a repeating unit represented by the following formula (a2), and the like.

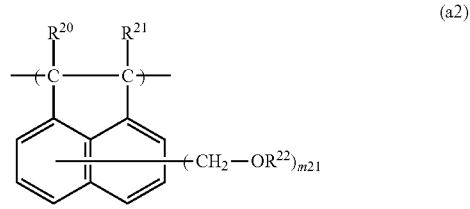

(a2)

In the above formula (a2), $R^{20}$ and $R^{21}$ each independently represent a hydrogen atom, a halogen atom, a monovalent hydrocarbon group having 1 to 10 carbon atoms, or a monovalent group obtained by combining this hydrocarbon group with at least one selected from the group consisting of —CO—, —COO—, —OCO—, —O—, —CS—, —S—, —SO—, —SO$_2$— and —NR$^F$—; and $R^F$ represents a hydrogen atom or a hydrocarbon group having 1 to 10 carbon atoms.

$R^{22}$ represents a hydrogen atom or a monovalent hydrocarbon group having 1 to 10 carbon atoms.

m21 is an integer of 0 to 6, and in the case in which m21 is 2 or greater, the plural $R^{22}$s may be the same or different.

Examples of each group represented by the above $R^{20}$ and $R^{21}$ include groups exemplified as each group represented by $R^{10}$ in the above formula (a1), and the like.

Examples of the monovalent hydrocarbon group having 1 to 10 carbon atoms represented by the $R^{22}$ include groups similar to those exemplified as monovalent hydrocarbon groups having 1 to 10 carbon atoms represented by $R^{10}$ in the above formula (a1), and the like.

The acenaphthylene resin can be obtained by polymerization through subjecting a compound having an acenaphthylene skeleton to an appropriate polymerization system such as block polymerization or solution polymerization by radical polymerization, anion polymerization, cation polymerization or the like. Alternatively, as is disclosed in paragraph nos. [0008] to [0031] of Japanese Unexamined Patent Application, Publication No. 2002-296789, the acenaphthylene resin can be also obtained by allowing the polymer of the compound having an acenaphthylene skeleton to react with paraformaldehyde under an acidic condition, and the like.

The styrene resin is exemplified by resins that include a structural unit derived from styrene or a derivative thereof, and the like. Examples of the styrene resin include resins that include a structural unit represented by the following formula (a3), and the like.

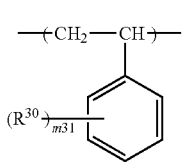

(a3)

In the above formula (a3), $R^{30}$ represents a halogen atom or a monovalent hydrocarbon group having 1 to 10 carbon atoms, or a monovalent group obtained by combining this hydrocarbon group with at least one selected from the group consisting of —CO—, —COO—, —OCO—, —O—, —CS—, —S—, —SO—, —SO$_2$— and —NR$^G$—; R$^G$ represents a hydrogen atom or a monovalent hydrocarbon group having 1 to 10 carbon atoms.

m31 is an integer of 0 to 5, and in the case in which m31 is 2 or greater, the plural $R^{30}$s may be the same or different.

Examples of each group represented by the $R^{30}$ include groups exemplified as each group represented by $R^{10}$ in the above formula (a1), and the like.

The styrene resin may have other structural unit in addition to the structural unit represented by the above formula (a3).

The monomer that gives the other structural unit is not particularly limited, and various compounds having a polymerizable unsaturated bond may be included. Examples of the compound having such a polymerizable unsaturated bond include styrene monomers such as α-methylstyrene; acrylic monomers such as (meth)acrylonitrile, (meth)acrylic acid, (meth)acrylic acid esters such as (meth)methyl acrylate, and (meth)acrylamide; vinyl ethers such as ethyl vinyl ether, maleic anhydride, vinyl acetate, vinylpyridine, and the like.

The proportion of the other structural unit contained in the styrene resin is preferably less than 50 mol %, and more preferably less than 40 mol % with respect to the total of the structural units constituting the styrene resin.

The degree of polymerization of the styrene resin, i.e., the total number of the structural unit represented by the above formula (a3) and the other structural unit is preferably no less than 5 and no greater than 200, and more preferably no less than 10 and no greater than 150.

As a polymer precursor for forming the styrene resin (particularly, polyvinyl phenol polymer), a commercially available product may be used, and examples of the commercially available product include "Maruka Linker M™ (poly-p-vinyl phenol), "linker MB" (brominated poly-p-vinyl phenol), "linker CMM" (p-vinyl phenol/methyl methacrylate copolymer), "linker CHM" (p-vinyl phenol/2-hydroxyethyl methacrylate copolymer), "linker CST" (p-vinyl phenol/styrene copolymer) manufactured by Maruzen Petrochemical Co., Ltd., and the like.

Examples of the polyarylene resin include polyarylene ether, polyarylene sulfide, polyarylene ether sulfone, polyarylene ether ketone, and the like.

The polystyrene equivalent weight average molecular weight of the resin (A) as measured on gel permeation chromatography (GPC)(hereinafter, may be also referred to as "Mw") is preferably 500 to 100,000, more preferably 1,000 to 50,000, and still more preferably 1,200 to 40,000.

The ratio (Mw/Mn) of the Mw of the resin (A) to the polystyrene equivalent number average molecular weight as measured on GPC (hereinafter, may be also referred to as "Mn") is typically 1 to 5, and preferably 1 to 3.

Also, the resin composition for forming a resist underlayer film according to the embodiment of the present invention may contain only one type of the resin (A), or 2 or more types thereof may be contained.

[Crosslinking Agent]

The crosslinking agent (hereinafter, may be also referred to as "crosslinking agent (B)") has a partial structure represented by the following formula (i). In other words, the structure of the compound constituting the crosslinking agent (B) includes at least a structure represented by the following formula (i) therein. It is to be noted that to a bonding hand having a partial structure represented by the following formula (i) may be linked a hydrogen atom, or other group may be linked thereto.

In the resin composition for forming a resist underlayer film of the embodiment of the present invention, a methylene moiety sandwiched between an aromatic ring of the resin (A) and a polycyclic aromatic ring of the crosslinking agent (B) is generated as a result of a reaction of the crosslinking agent (B) with the resin (A). Since the hydrogen atom included in this methylene moiety is likely to be oxidized, a new crosslinking point is generated. Thus, due to a cross-linked structure further generated by the newly generated crosslinking point, the hydrogen atom content of the entirety of the material decreases. It is therefore considered that flexural resistance of the formed resist underlayer film is improved.

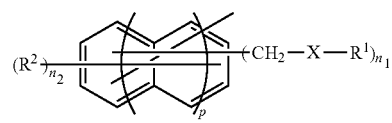

(i)

In the above formula (i), X represents an oxygen atom, a sulfur atom, *—COO— or —NR$^A$—, wherein R$^A$ represents a hydrogen atom or a monovalent hydrocarbon group having 1 to 30 carbon atoms, and * denotes a site bonded to R$^1$; R$^1$ represents a hydrogen atom or a monovalent hydrocarbon group having 1 to 30 carbon atoms; R$^2$ represents a hydroxy group, a sulfanil group, a cyano group, a nitro group, a monovalent hydrocarbon group having 1 to 30 carbon atoms, a monovalent oxyhydrocarbon group having 1 to 30 carbon atoms or a monovalent sulfanilhydrocarbon group having 1 to 30 carbon atoms; $n_1$ is an integer of 1 to 12; $n_2$ is an integer of 0 to 11, wherein the sum of $n_1$ and $n_2$ (i.e., ($n_1+n_2$)) is an integer of no greater than 12, and in the case in which X, R$^1$ and R$^2$ are each present in plural number, the plural Xs, R$^1$s and R$^2$s may be the same or different; and p is an integer of 1 to 3.

The monovalent hydrocarbon group having 1 to 30 carbon atoms represented by the R$^1$, R$^2$ and R$^A$ in —NR$^A$— is exemplified by a linear or branched monovalent chain hydrocarbon group having 1 to 30 carbon atoms, a monovalent alicyclic hydrocarbon group having 3 to 30 carbon atoms, a monovalent aromatic hydrocarbon group having 6 to 30 carbon atoms, or a group obtained by combining these groups, and the like.

Examples of the linear or branched monovalent chain hydrocarbon group having 1 to 30 carbon atoms include a methyl group, an ethyl group, a n-propyl group, an i-propyl group, a n-butyl group, a 2-methylpropyl group, a 1-methylpropyl group, a t-butyl group, a pentyl group, a hexyl group, an octyl group, a dodecyl group, and the like.

Examples of the monovalent alicyclic hydrocarbon group having 3 to 30 carbon atoms include a cyclopropyl group, a cyclobutyl group, a cyclopentyl group, a cyclohexyl group, a cyclooctyl group, a cyclododecyl group, a norbornyl group, an adamantyl group, and the like.

Examples of the monovalent aromatic hydrocarbon group having 6 to 30 carbon atoms include a phenyl group, a tolyl group, a naphthyl group, an anthryl group, a benzyl group, a phenethyl group, a naphthylmethyl group, and the like.

Examples of the monovalent oxyhydrocarbon group having 1 to 30 carbon atoms include: alkoxy groups having 1 to 30 carbon atoms such as a methoxy group, an ethoxy group and a propoxy group; cycloalkyloxy groups having 3 to 30 carbon atoms such as a cyclopentyloxy group and a norbornyloxy group; aryloxy groups having 6 to 30 carbon atoms such as a phenoxy group, a tolyloxy group and a naphthyloxy group; aralkyloxy groups having 7 to 30 carbon atoms such as a benzyloxy group and a naphthylmethoxy group, and the like.

Examples of the monovalent sulfanilhydrocarbon group having 1 to 30 carbon atoms include: alkylsulfanil groups having 1 to 30 carbon atoms such as a methylsulfanil group and an ethylsulfanil group; cycloalkyl sulfanil groups having 3 to 30 carbon atoms such as a cyclopentyl sulfanil group; arylsulfanil groups having 6 to 30 carbon atoms such as a phenylsulfanil group and a naphthylsulfanil group; aralkyl sulfanil groups having 7 to 30 carbon atoms such as a benzylsulfanil group, and the like.

The $n_1$ is preferably an integer of 1 to 8, more preferably an integer of 1 to 5, and still more preferably an integer of 1 to 3.

The $n_2$ is preferably an integer of 0 to 7, more preferably an integer of 0 to 5, and still more preferably an integer of 0 to 3.

The sum of $n_1$ and $n_2$ (i.e., ($n_1+n_2$)) is an integer of preferably 1 or greater and 8 or less, and more preferably 1 or greater and 7 or less; and p is preferably 1 or 2.

Examples of the crosslinking agent (B) include a compound represented by the following formula (b1), a compound represented by the following formula (b2), and the like.

selected from the group consisting of —CO—, —COO—, —OCO—, —O—, —CS—, —S—, —SO—, —SO$_2$— and —NR$^C$—, wherein R$^C$ represents a hydrogen atom or a monovalent hydrocarbon group having 1 to 30 carbon atoms; $n_3$ is an integer of 1 to 11; $n_4$ is an integer of 0 to 11, wherein the sum of $n_3$ and $n_4$ (i.e., ($n_3+n_4$)) is an integer of no greater than 11; $n_5$ is an integer of 1 to 11; $n_6$ is an integer of 0 to 11, wherein the sum of $n_5$ and $n_6$ (i.e., ($n_5+n_6$)) is an integer of no greater than 11; $n_7$ is an integer of 1 to 9, and in the case in which $n^7$ is no less than 2, the plural R$^3$s may be the same or different; q is an integer of 1 to 3; and r is an integer of 1 to 3.

The bivalent hydrocarbon group having 1 to 30 carbon atoms represented by the R$^3$ is exemplified by a linear or branched bivalent chain hydrocarbon group having 1 to 30 carbon atoms, bivalent alicyclic hydrocarbon group having 3 to 30 carbon atoms, bivalent aromatic hydrocarbon group having 6 to 30 carbon atoms, or a group obtained by combining these groups, and the like.

The linear or branched bivalent chain hydrocarbon group having 1 to 30 carbon atoms is preferably a linear or branched alkylene group having 2 to 8 carbon atoms, and examples thereof include an ethylene group, a propylene group, a butylene group, a hexylene group, an octylene group, and the like.

The bivalent alicyclic hydrocarbon group having 3 to 30 carbon atoms is preferably an alicyclic hydrocarbon group having 5 to 12 carbon atoms, and examples thereof include monocyclic alicyclic hydrocarbon groups such as a cyclopentylene group and a cyclohexylene group; groups derived by removing two hydrogen atoms from a polycyclic hydrocarbon such as norbornane or adamantane, and the like.

The bivalent aromatic hydrocarbon group having 6 to 30 carbon atoms is preferably an aromatic hydrocarbon group having 6 to 15 carbon atoms, and examples thereof include a phenylene group, a tolylene group, a naphthylene group, and the like.

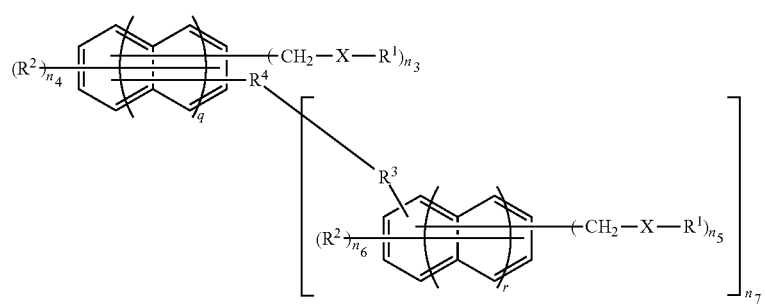

(b1)

In the above formula (b1), X, R$^1$ and R$^2$ are as defined in the above formula (i); R$^3$ represents a single bond, a substituted or unsubstituted bivalent hydrocarbon group having 1 to 30 carbon atoms, —CO—, —COO—, —OCO—, —O—, —CS—, —S—, —SO—, —SO$_2$— or —NR$^B$—, or a bivalent group obtained by combining these groups, wherein R$^B$ represents a hydrogen atom or a monovalent hydrocarbon group having 1 to 30 carbon atoms; R$^4$ represents, in the case in which $n^7$ is 1, a single bond, a substituted or unsubstituted bivalent hydrocarbon group having 1 to 30 carbon atoms, —CO—, —COO—, —OCO—, —O—, —CS—, —S—, —SO—, —SO$_2$— or —NR$^C$—, or a bivalent group obtained by combining these groups, and in the case in which $n^7$ is 2 or greater, R$^4$ represents a substituted or unsubstituted hydrocarbon group having a valency of ($n_7+1$) and having 1 to 30 carbon atoms, or a group having a valency of ($n_7+1$) obtained by combining the hydrocarbon group with at least one The hydrocarbon group having a valency of ($n_7+1$) and having 1 to 30 carbon atoms represented by the R$^4$ is exemplified by a linear or branched chain hydrocarbon group having a valency of ($n_7+1$) and having 1 to 30 carbon atoms, a bivalent alicyclic hydrocarbon group having 3 to 30 carbon atoms, an aromatic hydrocarbon group having a valency of ($n_7+1$) and having 6 to 30 carbon atoms, a group obtained by combining these groups, and the like.

Examples of the chain hydrocarbon group having a valency of ($n_7+1$) and having 1 to 30 carbon atoms include groups derived by removing ($n_7+1$) hydrogen atoms from a chain hydrocarbon such as methane, ethane, propane, butane, ethylene or acetylene, and the like.

Examples of the alicyclic hydrocarbon group having a valency of ($n_7+1$) and having 3 to 30 carbon atoms include groups derived by removing ($n_7+1$) hydrogen atoms from an alicyclic hydrocarbon such as cyclopropane, cyclobutane, cyclopentane or cyclohexane, and the like.

Examples of the aromatic hydrocarbon group having a valency of ($n_7$+1) and having 6 to 30 carbon atoms include groups derived by removing ($n_7$+1) hydrogen atoms from an aromatic hydrocarbon such as benzene, naphthalene, anthracene, pyrene or coronene, and the like.

The substituent included in the hydrocarbon group represented by the $R^3$ and $R^4$ is exemplified by a halogen atom, a hydroxy group, and the like. Examples of the halogen atom include fluorine, chlorine, bromine, iodine, and the like.

The group obtained by combining the bivalent hydrocarbon group with at least one selected from the group consisting of —CO—, —COO—, —OCO—, —O—, —CS—, —S—, —SO—, —SO$_2$— and —NR$^B$— represented by the $R^3$ is exemplified by groups derived by removing two hydrogen atoms from the structure represented by the following formulae (R-1) to (R-4), and the like.

The group obtained by combining the bivalent hydrocarbon group with at least one selected from the group consisting of —CO—, —COO—, —OCO—, —O—, —CS—, —S—, —SO—, —SO$_2$— and —NR$^C$— represented by the $R^4$ is exemplified by groups derived by removing ($n_7$+1) hydrogen atoms from the structure represented by the following formulae (R-1) to (R-4), and the like.

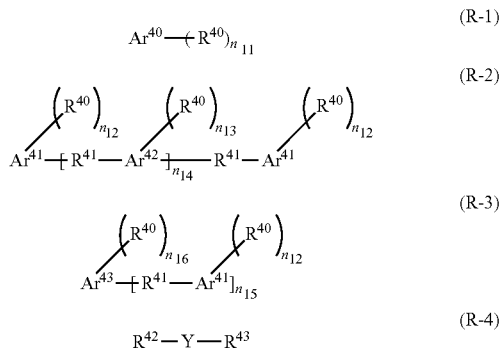

In the above formulae (R-1) to (R-4), $Ar^{40}$ represents an aromatic hydrocarbon group having a valency of n11 and having 6 to 20 carbon atoms; $Ar^{41}$ each independently represents aromatic hydrocarbon group having a valency of (n12+1) and having 6 to 20 carbon atoms; $Ar^{42}$ represents an aromatic hydrocarbon group having a valency of ($n_{13}$+2) and having 6 to 20 carbon atoms; and $Ar^{43}$ represents an aromatic hydrocarbon group having a valency of ($n_{15}$+$n_{16}$) and having 6 to 20 carbon atoms, and in the case in which $Ar^{41}$ and $Ar^{42}$ are each present in plural number, the plural $Ar^{41}$s and $Ar^{42}$s may be the same or different.

$R^{40}$ each independently represents a monovalent chain hydrocarbon group having 1 to 10 carbon atoms or a monovalent alicyclic hydrocarbon group having 3 to 10 carbon atoms, or a group obtained by combining the group with at least one selected from the group consisting of —CO—, —COO—, —OCO—, —O—, —CS—, —S—, —SO—, —SO$_2$— and —NR$^G$—, and in the case in which $R^{40}$ is present in plural number, $R^{40}$s may be the same or different; and $R^G$ represents a hydrogen atom or a monovalent hydrocarbon group having 1 to 20 carbon atoms.

$R^{41}$ each independently represents a single bond, —CO—, —COO—, —OCO—, —O—, —CS—, —S—, —SO—, —SO$_2$—, —NR$^H$—, a bivalent chain hydrocarbon group having 1 to 10 carbon atoms, a bivalent alicyclic hydrocarbon group having 3 to 10 carbon atoms, or a bivalent group obtained by combining these groups, and in the case in which $R^{41}$ is present in plural number, the plural $R^{41}$s may be the same or different; and $R^H$ represent a hydrogen atom or a hydrocarbon group having 1 to 20 carbon atoms.

$R^{42}$ and $R^{43}$ represent a monovalent chain hydrocarbon group having 1 to 10 carbon atoms or a monovalent alicyclic hydrocarbon group having 3 to 10 carbon atoms, or taken together represent a ring structure constructed from these groups together with Y to which these groups bond.

$n_{11}$ is an integer of 1 to 6; $n_{12}$ is an integer of 0 to 5; $n_{13}$ is an integer of 0 to 4; $n_{14}$ is an integer of 0 to 5; $n_{15}$ is an integer of 1 to 6; $n_{16}$ is an integer of 0 to 5; Y represents —CO—, —COO—, —OCO—, —O—, —CS—, —S—, —SO—, —SO$_2$— or —NR$^I$—; and $R^I$ represents a hydrogen atom or a hydrocarbon group having 1 to 20 carbon atoms.

In the case in which $R^{40}$, $R^{41}$, $Ar^{41}$ and $Ar^{42}$ are each present in plural number, the plural $R^{40}$s, $R^{41}$s, $Ar^{41}$s and $Ar^{42}$s may be the same or different.

Examples of the monovalent chain hydrocarbon group having 1 to 10 carbon atoms represented by $R^{40}$, $R^{42}$ and $R^{43}$ in the above formulae (R-1) to (R-4) include a methyl group, an ethyl group, a n-propyl group, an i-propyl group, a n-butyl group, a 2-methylpropyl group, a 1-methylpropyl group, a t-butyl group, and the like.

Examples of the monovalent alicyclic hydrocarbon group having 1 to 10 carbon atoms represented by $R^{40}$, $R^{42}$ and $R^{43}$ in the above formulae (R-1) to (R-4) include a cyclopropyl group, a cyclobutyl group, a cyclopentyl group, a cyclohexyl group, a cyclooctyl group, a cyclododecyl group, and the like.

Examples of the bivalent chain hydrocarbon group having 1 to 10 carbon atoms represented by $R^{41}$ in the above formulae (R-2) to (R-3) include a methylene group, an ethylene group, a 1,2-propylene group, a 1,3-propylene group, a tetramethylene group, a pentamethylene group, a hexamethylene group, a heptamethylene group, an octamethylene group, and the like.

Examples of the bivalent alicyclic hydrocarbon group having 3 to 10 carbon atoms represented by $R^{41}$ in the above formulae (R-2) to (R-3) include monocyclic alicyclic hydrocarbon groups such as a cyclopentylene group and a cyclohexylene group; groups derived by removing two hydrogen atoms from a polycyclic hydrocarbon such as norbornane or adamantane, and the like.

In addition, $R^{40}$ to $R^{43}$ in the above formulae (R-1) to (R-4) may have a substituent. The substituent is exemplified by a halogen atom, a hydroxy group, and the like.

Examples of the halogen atom include fluorine, chlorine, bromine, iodine, and the like.

$n_3$ and $n_5$ in the above formula (b1) are preferably an integer of 1 to 7, more preferably an integer of 1 to 5, and still more preferably an integer of 1 to 3.

$n_4$ and $n_6$ in the above formula (b1) are preferably an integer of 0 to 7, more preferably an integer of 0 to 5, and still more preferably an integer of 0 to 3.

$n_7$ in the above formula (b1) is preferably an integer of 1 to 5, more preferably an integer of 1 to 3, and still more preferably 1; q in the above formula (b1) is preferably 1 or 2, and more preferably 1; r in the above formula (b1) is preferably 1 or 2, and more preferably 1.

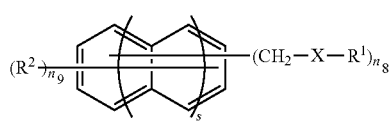
(b2)

In the above formula (b2), X, $R^1$ and $R^2$ are as defined in the above formula (i); $n_8$ is an integer of 1 to 12; $n_9$ is an integer of 0 to 11, wherein the sum of $n_8$ and $n_9$ (i.e., ($n_8+n_9$)) is an integer of no greater than 12; and s is an integer of 1 to 3.

$n_8$ in the above formula (b2) is preferably an integer of 1 to 8, more preferably an integer of 1 to 5, and still more preferably an integer of 1 to 3.

$n_9$ in the above formula (b2) is preferably an integer of 0 to 7, more preferably an integer of 0 to 5, and still more preferably an integer of 0 to 3; and s is preferably 1 or 2.

The crosslinking agent (B) is exemplified by compounds represented by the following formulae (B-1) to (B-12), and the like.

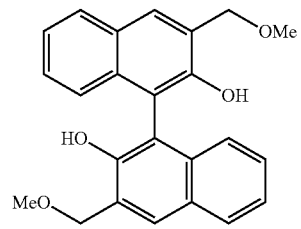
(B-1)

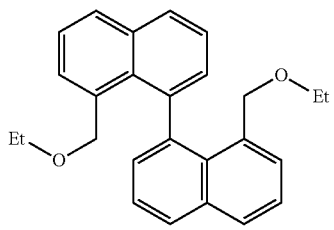
(B-2)

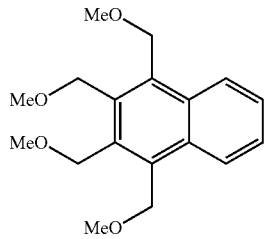
(B-3)

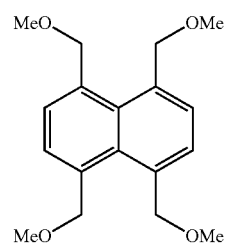
(B-4)

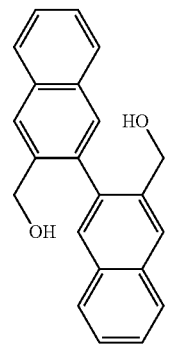
(B-5)

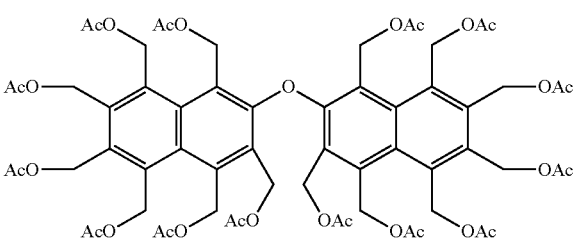
(B-6)

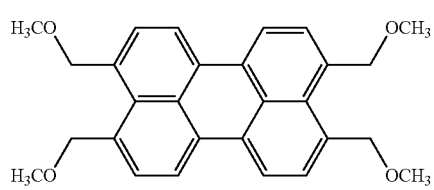
(B-7)

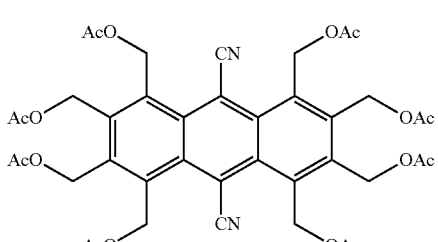
(B-8)

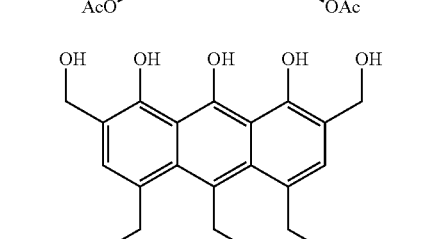
(B-9)

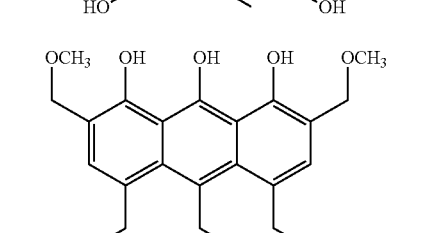
(B-10)

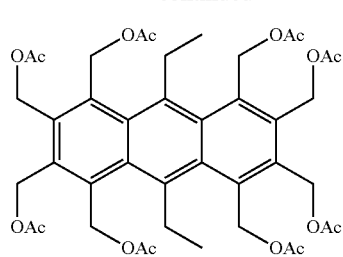

(B-11)

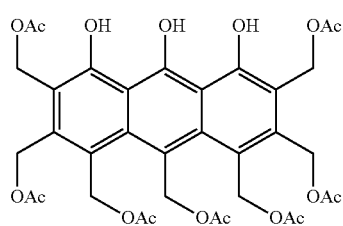

(B-12)

In the above formulae (B-6), (B-8), (B-11) and (B-12), Ac represents an acetyl group (—$COCH_3$).

These crosslinking agents (B) may be used either alone, or at least two types thereof may be used in combination.

The amount of the crosslinking agent (B) blended is typically no greater than 500 parts by mass, preferably no less than 1 part by mass and no greater than 100 parts by mass, more preferably no less than 2 parts by mass and no greater than 50 parts by mass with respect to 100 parts by mass of the resin (A).

[Other Crosslinking Agent]

Other crosslinking agent except for the crosslinking agent (B) described above may be blended with the resin composition for forming a resist underlayer film in the range not to impair the effects of the present invention.

The other crosslinking agent is exemplified by polynuclear phenols, a variety of commercially available curing agents, and the like. As such other crosslinking agents, crosslinking agents described in, for example, paragraph nos. [0085] to [0086] of Japanese Unexamined Patent Application, Publication No. 2004-168748, and the like may be used.

These other crosslinking agents may be used either alone, or at least two types thereof may be used in combination. Alternatively, polynuclear phenols and a curing agent may be used in combination.

The amount of the other crosslinking agent blended is typically no greater than 500 parts by mass, and preferably no greater than 100 parts by mass with respect to 100 parts by mass of the resin (A).

[Solvent]

Although the resin composition for forming a resist underlayer film contains the resin (A) and the crosslinking agent (B) described above, this composition is a liquid composition usually containing a solvent (hereinafter, may be also referred to as "solvent (C)") that dissolves the resin (A).

The solvent (C) is not particularly limited as long as it dissolves the resin (A); however, for example, those described in paragraph nos. [0070] to [0073] of Japanese Unexamined Patent Application, Publication No. 2004-168748, and the like may be used.

Among these solvents (C), propylene glycol monomethyl ether, ethylene glycol monoethyl ether acetate, ethyl lactate, n-butyl acetate, ethyl 3-ethoxypropionate, methyl 3-methoxypropionate; ketones such as 2-heptanone and cyclohexanone; and γ-butyrolactone are preferred.

It is to be noted that the solvent (C) may be used either alone, or at least two types thereof may be used in combination.

The amount of the solvent (C) used typically falls within the range that gives the concentration of the solid content of the resulting composition being usually 1 to 80% by mass, preferably 3 to 40% by mass, and more preferably 5 to 30% by mass.

In the resin composition for forming a resist underlayer film, (D) an acid generating agent, (E) an accelerator, (F) other additive (F), and the like may be blended as needed in the range not to impair the effects of the present invention. Among these, the acid generating agent (D) is preferably blended.

[Acid Generating Agent (D)]

The acid generating agent (D) is a component that generates an acid upon exposure or heating. By containing the acid generating agent (D), the resin composition for forming a resist underlayer film enables a crosslinking reaction to be caused between molecular chains of the resin (A) and the like at comparatively low temperatures including normal temperatures.

The acid generating agent that generates an acid upon exposure (hereinafter, may be referred to as "photoacid generating agent") is exemplified by acid generating agents described in, for example, paragraph nos. [0077] to [0081] of Japanese Unexamined Patent Application, Publication No. 2004-168748, and the like.

Also, examples of the acid generating agent that generates an acid upon heating (hereinafter, may be referred to as "thermal acid generating agent") include 2,4,4,6-tetrabromocyclohexadienone, benzoin tosylate, 2-nitrobenzyl tosylate, alkyl sulfonates and the like in addition to the onium salt-type acid generating agent exemplified as the photo acid generating agent.

Among these acid generating agents, thermal acid generating agents are preferred, onium salt-type acid generating agents are more preferred, and iodonium salt-type acid generating agents are more preferred. The acid generating agent is particularly preferably diphenyliodonium trifluoromethane sulfonate, diphenyliodonium nonafluoro-n-butane sulfonate, diphenyliodonium pyrenesulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, and more particularly preferably diphenyliodonium trifluoromethanesulfonate.

The amount of the acid generating agent (D) blended is typically no greater than 5,000 parts by mass, preferably 0.1 to 1,000 parts by mass, and more preferably 0.1 to 100 parts by mass with respect to 100 parts by mass of the resin (A). The acid generating agent (D) may be used either alone, or in combination of two or more types thereof. Also, the photo acid generating agent and the thermal acid generating agent may be used in combination as the acid generating agent (D).

[Accelerator (E)]

The accelerator (E) is exemplified by one-electron oxidants and the like for sufficiently causing a dehydrogenation reaction required for oxidative crosslinking. The one-electron oxidant means an oxidizing agent that causes transfer of one electron therein. For example, in the case of cerium (IV) nitrate ammonium, a cerium ion (IV) receives one electron to be converted into a cerium ion (III). A radical oxidizing agent such as halogen receives one electron to be converted into an anion. Accordingly, an event of oxidizing a substance to be oxidized (e.g., substrate, catalyst, etc.) by depleting one electron from the substance to be oxidized is referred to as "one electron oxidization", and a component that receives the one electron in this event is referred to as "one-electron oxidant".

Typical examples of the one-electron oxidant include (a) metal compounds, (b) peroxides, (c) diazotized compounds, (d) halogen or halogen acids, and the like.

Examples of the metal compound (a) include metal compounds that include cerium, lead, silver, manganese, osmium, ruthenium, vanadium, thallium, copper, iron, bismuth or nickel, and the like. Specific examples include: (a1) cerium salts (for example, quadrivalent cerium salts) such as cerium (IV) ammonium nitrate (CAN: ammonium hexanitratocerate (IV)), cerium (IV) acetate, cerium (IV) nitrate and cerium (IV) sulfate; (a2) lead compounds (e.g., quadrivalent lead compound) such as lead tetraacetate and lead (IV) oxide, (a3) silver compounds such as silver (I) oxide, silver (II) oxide, silver carbonate (Fetizonre agent) and silver nitrate; (a4) manganese compounds such as permanganate, activated manganese dioxide and manganese (III) salts, (a5) osmium compounds such as osmium tetraoxide; (a6) ruthenium compounds such as ruthenium salts; (a7) vanadium compounds such as $VOCl_3$, $VOF_3$, $V_2O_5$, $NH_4VO_3$ and $NaVO_3$; (a8) thallium compounds such as thallium (III) acetate, trifluorothallium (III) acetate and thallium (III) nitrate; (a9) copper compounds such as copper (II) acetate, copper (II) trifluoromethane sulfonate, copper (II) trifluoroborate, copper (II) chloride and copper (I) acetate; (a10) iron compounds such as iron (III) chloride and potassium hexacyanoferrate (III); (a11) bismuth compounds such as sodium bismuthate; (a12) nickel compounds such as nickel peroxide, and the like.

Examples of the peroxides (b) include peracids such as peracetic acid and m-chloroperbenzoic acid; hydrogen peroxide, and hydroxyperoxides of such as alkylhydroxyperoxides such as t-butylhydroperoxide; diacyl peroxide, peracid esters, peracid ketal, peroxydicarbonate, dialkyl peroxide, peracid ketone, and the like.

Examples of the diazotized compounds (c) include 2,2'-azobisisobutyronitrile, and the like.

Examples of the halogen or halogen acid (d) include halogen selected from chlorine, bromine and iodine, perhalogen acid, halogen acid, halogenous acid, hypohalous acid and salts thereof, and the like. It is to be noted that halogen in the halogen acid is exemplified by chlorine, bromine and iodine. Alternatively, specific examples of the halogen acid or salts thereof may include sodium perchlorate, sodium bromate, and the like.

Of these one-electron oxidants, the peroxides (b) and the diazotized compounds (c) are preferred, and particularly, m-chloroperbenzoic acid, t-butylhydroperoxide, and 2,2'-azobisisobutyronitrile are preferred. These are preferably used since metal residues and the like are less likely to be attached on the substrate.

It is to be noted that the accelerator (E) such as the one-electron oxidant may be used either alone, or two or more types of these may be used in combination.

The amount of the accelerator (E) blended is typically no greater than 1,000 parts by mass, more preferably 0.01 to 500 parts by mass, and more preferably 0.1 to 100 parts by mass with respect to 100 parts by mass of the resin (A).

[Other Additive (F)]

The other additive (F) is exemplified by a binder resin, a radioactive ray-absorbing agent, a surfactant, and the like. These other additives (F) may be used either each alone, or in combination of two or more types thereof.

As the other additive (F), for example, those described in paragraph nos. [0088] to [0093] of Japanese Unexamined Patent Application, Publication No. 2004-168748, and the like may be used.

As the binder resin, any of a variety of thermoplastic resins and thermosetting resins (other than the resin (A)) may be used. The thermoplastic resin is a component having an effect of providing the underlayer film with flow performances, mechanical characteristics, and the like of the thermoplastic resin added. Also, the thermosetting resin is a component that becomes insoluble in a solvent by curing with heat, thereby achieving an effect of inhibiting intermixing of the resultant resist underlayer film and the resist film formed thereon, and thus can be preferably used as the binder resin (G). Among the foregoings, thermosetting resins such as urea resins, melamine resins, and aromatic hydrocarbon resins are preferred.

The amount of the binder resin blended is typically no greater than 20 parts by mass, and more preferably no greater than 10 parts by mass with respect to 100 parts by mass of the resin (A).

The amount of the radioactive ray-absorbing agent blended is typically no greater than 20 parts by mass, and more preferably no greater than 100 parts by mass with respect to 50 parts by mass of the resin (A).

The surfactant is a component having an effect of improving the coating properties, striation, wettability, developability, and the like.

The amount of the surfactant blended is typically no greater than 15 parts by mass, and more preferably no greater than 10 parts by mass with respect to 100 parts by mass of the resin (A).

Moreover, the resin composition for forming a resist underlayer film may contain, in addition to the other additive (F) described above, for example, a storage stabilizer, a defoaming agent, an adhesion promoter, and the like.

(2) Resist Underlayer Film

The resist underlayer film according to another embodiment of the present invention is formed from the resin composition for forming a resist underlayer film. It is to be noted that with respect to the resin composition for forming a resist underlayer film, details of the resin composition for forming a resist underlayer film according to an embodiment of the present invention described above may be adopted as they are.

The resist underlayer film can be suitably used in a multilayer resist process including: providing a resist underlayer film on a substrate; providing a resist pattern on the resist underlayer film; then transferring the resist pattern once to the resist underlayer film to form an underlayer film pattern; and thereafter transferring the underlayer film pattern by using as an etching mask to the substrate.

The content of hydrogen of the resist underlayer film is preferably 0 to 50 atom %, and more preferably 0 to 35 atom %. It is to be noted that the method for determining the content of hydrogen in the resist underlayer film is similar to the method in Examples described later.

Although such a method for forming a resist underlayer film is not particularly limited, for example, the method for forming a resist underlayer film of yet another embodiment of the present invention described below, and the like may be exemplified.

(3) Method for Forming a Resist Underlayer Film

The method for forming a resist underlayer film according to another embodiment of the present invention includes the steps of: providing a coating film using the resin composition for forming a resist underlayer film; and heating the coating film. It is to be noted that with respect to the resin composition for forming a resist underlayer film, details of the resin composition for forming a resist underlayer film described above may be adopted as they are.

The resist underlayer film is in general, formed on the upper face side of a substrate. As the substrate, for example, a silicon wafer, a wafer covered with aluminum, or the like may be used.

Also, the method for coating the resin composition for forming a resist underlayer film onto the substrate is not particularly limited, but an appropriate method such as spin coating, cast coating or roll coating may be employed.

Furthermore, the coating film is generally heated in ambient air.

The heating temperature in this step is typically 300° C. to 500° C., and preferably 350° C. to 450° C. When the heating temperature is less than 300° C., oxidative crosslinking does not sufficiently proceed, whereby characteristics needed as an underlayer film may not be exhibited.

The heating time in this step is 30 to 1,200 sec, and preferably 60 to 600 sec.

Moreover, the oxygen concentration during curing the coating film is preferably no less than 5% by volume. When the oxygen concentration during forming the coating film is low, the oxidative crosslinking of the resist underlayer film does not sufficiently proceed, whereby characteristics needed as a resist underlayer film may fail to be exhibited.

In addition, the coating film may be preheated at a temperature of 60° C. to 250° C. prior to heating at a temperature of 300° C. to 500° C.

The heating time in the preheating is not particularly limited, and is preferably 10 sec to 300 sec, and more preferably 30 sec to 180 sec.

The preheating causes the solvent to vaporize beforehand and makes the film become compact, whereby the dehydrogenation reaction can efficiently proceed.

Moreover, in the method for forming a resist underlayer film, the coating film is usually cured by heating the coating film to form a resist underlayer film. However, it is also possible to form the resist underlayer film by adding a certain photocuring agent (crosslinking agent) to the composition for forming a resist underlayer film, and permitting photocuring by subjecting to an exposing process of the heated coating film. The type of a radioactive ray used for the exposure is appropriately selected according to the type of the acid generating agent added to the resin composition for forming a resist underlayer film from among visible rays, ultraviolet rays, far ultraviolet rays, X-rays, electron beams, γ-rays, molecular beams, ion beams, and the like.

(4) Pattern-Forming Method

The pattern-forming method according to yet another embodiment of the present invention includes the steps of:

providing a resist underlayer film on the upper face side of a substrate using the resin composition for forming a resist underlayer film (hereinafter, may be also referred to as "step (1)");

providing a resist film on the upper face side of the resist underlayer film using a resist composition (hereinafter, may be also referred to as "step (2)");

exposing the resist film (hereinafter, may be also referred to as "step (3)");

forming a resist pattern by developing the exposed resist film (hereinafter, may be also referred to as "step (4)"); and sequentially dry etching the resist underlayer film and the substrate using the resist pattern as a mask (hereinafter, may be also referred to as "step (5)").

[Step (1)]

In the step (1), a resist underlayer film is provided on the upper face side of a substrate. It is to be noted that with respect to the method for forming a resist underlayer film, the details described above may be adopted as they are.

The resist underlayer film provided in this step (1) has a film thickness of typically 0.1 μm to 5 μm.

Also, the pattern-forming method may further include (1') a step of providing an intermediate layer (intermediate film) on the resist underlayer film after the step (1) as needed. The intermediate layer is a layer for reinforcing the functions possessed by the resist underlayer film and/or the resist film or for providing functions with the resist underlayer film and/or the resist film which are not possessed by these films, in forming a resist pattern. In the case in which an antireflective film is, for instance, provided as the intermediate layer, the intermediate film can reinforce the antireflection function of the resist underlayer film.

The intermediate layer may be formed from an organic compound or an inorganic oxide. Examples of the organic compound include materials commercially available under the trade names of "DUV-42", "DUV-44", "ARC-28", "ARC-29" and the like manufactured by Brewer Science, Inc., and "AR-3", "AR-19" and the like manufactured by Lohm and Haas Company, and the like. Also, examples of the inorganic oxide include materials commercially available under trade names of "NFC SOG01", "NFC SOG04", "NFC SOG080" and the like manufactured by JSR Corporation, as well as polysiloxane, titanium oxide, alumina oxide, tungsten oxide and the like produced according to a CVD method.

The method of providing the intermediate layer is not particularly limited, but for example, a coating method, a CVD method or the like can be employed. Of these, the coating method is preferred. When the coating method is employed, the intermediate layer may be successively provided after providing the resist underlayer film.

The film thickness of the intermediate layer is not particularly limited, and may be appropriately selected according to functions demanded for the intermediate layer. The film thickness of the intermediate layer is preferably 10 nm to 3,000 nm, and more preferably 20 nm to 300 nm.

[Step (2)]

In the step (2), a resist film is provided on the upper face side of the resist underlayer film using a resist composition. Specifically, after coating the resist composition such that the resultant resist film has a predetermined film thickness, the solvent in the coating film is volatilized by prebaking, or the like, to provide the resist film.

Examples of the resist composition include a positive type or negative type chemically amplified resist composition containing a photoacid generating agent, a positive type resist composition including an alkali-soluble resin and a quinonediazide-based sensitizer, a negative type resist composition including an alkali-soluble resin and a crosslinking agent, and the like.

The resist composition for use in forming the resist film on the resist underlayer film may have a solid content of usually about 5 to 50% by mass, and in general, the resist composition is subjected to formation of the resist film after filtering through a filter with a pore size of about 0.2 μm, for example. It is to be noted that a commercially available resist composition may be used as is in this step.

The coating method of the resist composition is not particularly limited, and for example, a spin coating method or the like may be performed. In addition, the temperature of the prebaking may be appropriately adjusted according to the type and the like of the resist composition solution used, but is usually about 30° C. to 200° C., and preferably 50° C. to 150° C.

[Step (3)]

In the step (3), a predetermined region of the resulting resist film is irradiated with a radioactive ray to execute selective exposure.

The radioactive ray for use in the exposure is appropriately selected according to the type of the photoacid generating agent used in the resist composition from among visible rays, ultraviolet rays, far ultraviolet rays, X-rays, electron beams, γ-rays, molecular beams, ion beams, and the like. In particular, far ultraviolet rays are preferred, and a KrF excimer laser (wavelength: 248 nm), an ArF excimer laser (wavelength: 193 nm), an $F_2$ excimer laser (wavelength: 157 nm), a $Kr_2$ excimer laser (wavelength: 147 nm), an ArKr excimer laser (wavelength: 134 nm) and extreme ultraviolet rays (wavelength: 13 nm, etc.) are particularly preferred.

[Step (4)]

In the step (4), the resist pattern is formed by development of the resist film after the exposure step with a developer solution. The developer solution used in this step is appropriately selected according to the type of the resist composition. Specific examples include alkaline aqueous solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethyl ammonium hydroxide, tetraethyl ammonium hydroxide, pyrrole, piperidine, choline, 1,8-diazabicyclo[5.4.0]-7-undecene, 1,5-diazabicyclo[4.3.0]-5-nonene or the like. Also, an appropriate amount of a water-soluble organic solvent, for example, an alcohol such as methanol or ethanol, and a surfactant may be optionally added to the alkaline aqueous solution.

In addition, the resist film after developing with the aforementioned developer solution is washed and dried to form a predetermined resist pattern. It is to be noted that in the step, post-baking may be carried out after the exposure and before the development in order to improve the resolution, pattern profile, developability, and the like. The temperature of the post-baking is appropriately adjusted according to the type and the like of the resist composition used and is usually about 50° C. to 200° C., and preferably 70° C. to 150° C.

It is to be noted that the method for forming the resist pattern in the embodiment of the present invention may not involve a development process such as e.g., a nanoimprinting method.

[Step (5)]

In the step (5), a predetermined substrate pattern is obtained by sequentially dry etching the resist underlayer film and the substrate with the resist pattern obtained as a mask using, for example, gas plasma such as oxygen plasma.

The pattern-forming method using a resin composition for forming a resist underlayer film of the embodiment of the present invention may be exemplified by, in addition to the aforementioned pattern-forming method, methods for forming a pattern including a method for forming a resist pattern using a nanoimprinting method or the like.

EXAMPLES

Hereinafter, preferred modes for carrying out the present invention are explained in more detail by way of Examples. However, the present invention is not anyhow limited to these Examples. Herein, the "part" and "%" are on a mass basis unless otherwise stated particularly.

Note that the determination of the weight average molecular weight (Mw) herein was carried out by gel permeation chromatography (detector: differential refractometer) using "GPC column" (G2000HXL: two columns; and G3000HXL: one column) manufactured by Tosoh Corporation under an analytical condition including a flow rate of 1.0 mL/min and a column temperature of 40° C. with tetrahydrofuran as an elution solvent, using mono-dispersed polystyrene as a standard.

(1) Synthesis of Resin

Synthesis Example 1

In a reaction apparatus equipped with a capacitor, a thermometer and a stirring device were charged 100 parts of 2,7-dihydroxynaphthalene, 100 parts of propylene glycol monomethyl ether acetate and 50 parts of paraformaldehyde, and thereto were added 2 parts of oxalic acid. The temperature was elevated to 120° C. while permitting dehydration, and the reaction was allowed for 5 hrs. Then a resin (A-1) having a structural unit represented by the following formula (A-1) was obtained. The resulting resin (A-1) had the weight average molecular weight (Mw) of 2,000.

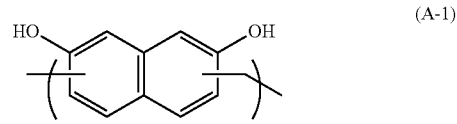

(A-1)

Synthesis Example 2

In a reaction apparatus equipped with a capacitor, a thermometer and a stirring device were charged 100 parts of fluorene bisphenol, 100 parts of propylene glycol monomethyl ether acetate and 50 parts of paraformaldehyde, and thereto were added 2 parts of oxalic acid. The temperature was elevated to 120° C. while permitting dehydration, and the reaction was allowed for 5 hrs. Then a resin (A-2) having a structural unit represented by the following formula (A-2) was obtained. The resulting resin (A-2) had the weight average molecular weight (Mw) of 4,000.

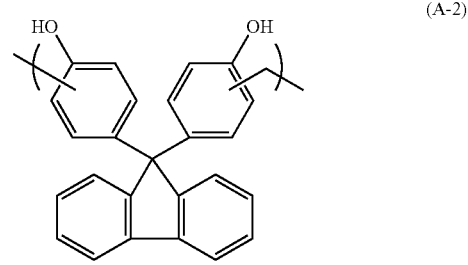

(A-2)

Synthesis Example 3

In a separable flask equipped with a thermometer were charged 100 parts of acenaphthylene, 78 parts of toluene, 52 parts of dioxane and 3 parts of azobisisobutyronitrile in a nitrogen atmosphere, and the mixture was stirred at 70° C. for 5 hrs. To the resultant resin having a molecular weight of 10,000 were added 5.2 parts of p-toluenesulfonic monohydrate and 40 parts of paraformaldehyde, and the temperature was elevated to 120° C. The mixture was further stirred for 6 hrs. Thereafter, the reaction solution was charged into a large quantity of isopropanol, and the precipitated resin was filtered to obtain a resin (A-3) constituted with a structural unit represented by the above formula (A-2).

The resulting resin (A-3) had the weight average molecular weight (Mw) of 20,000.

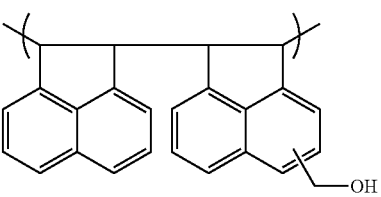

(A-3)

(2) Preparation of Resin Composition for Forming a Resist Underlayer Film

Example 1

As shown in Table 1, 10 parts of the resin (A-1), 1 part of a crosslinking agent (the following compound (B-1)), and 0.5 parts of a thermal acid generating agent (diphenyliodonium trifluoromethane sulfonate (D-1)) were dissolved in 90 parts of a solvent (propylene glycol monomethyl ether acetate (C-1)). This solution was filtered through a membrane filter having a pore size of 0.1 μm to prepare a resin composition for forming a resist underlayer film of Example 1.

Examples 2 to 12

Each resin composition for forming a resist underlayer film of Examples 2 to 12 was prepared in a similar manner to Example 1 except that each component of the type and the amount blended shown in Table 1 was used.

It is to be noted that the resins (A-1) to (A-3) used in Examples 1 to 12 shown in Table 1 are the resins obtained in Synthesis Examples 1 to 3 described above. In addition, the crosslinking agents (B-1) to (B-12) shown in Table 1 are as in the following.

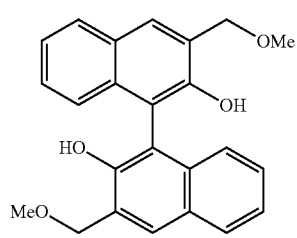

(B-1)

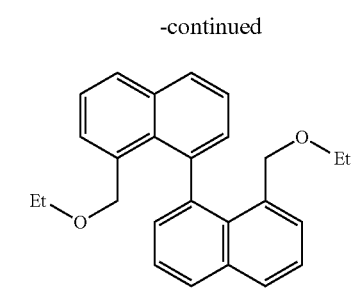

(B-2)

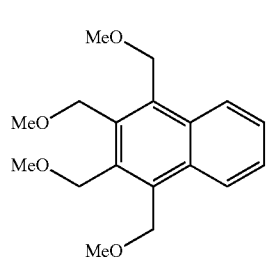

(B-3)

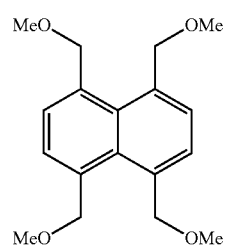

(B-4)

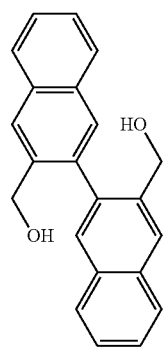

(B-5)

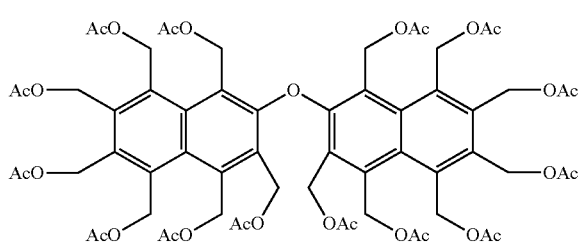

(B-6)

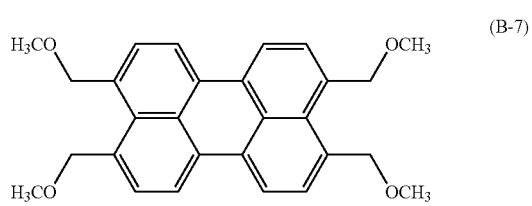

(B-7)

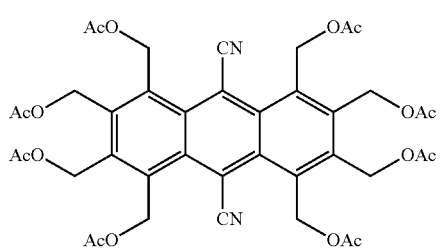
(B-8)

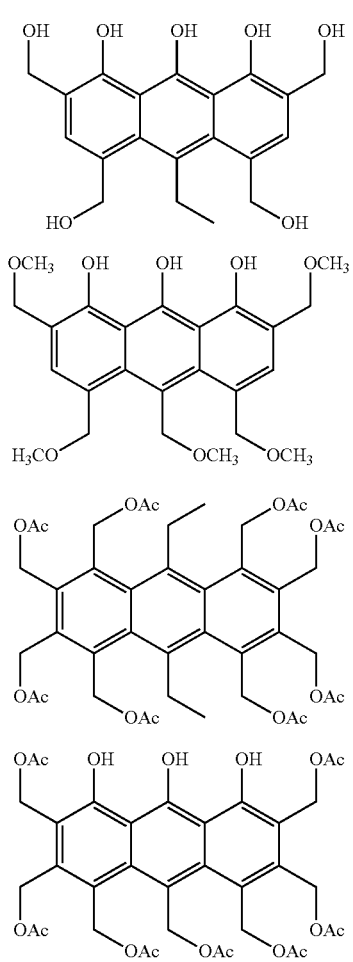

(B-9)

(B-10)

(B-11)

(B-12)

It is to be noted that the crosslinking agents (B-1) to (B-12) were synthesized with reference to the following documents, respectively.
- (B-1): Guo, Qun-Sheng; Lu, Yong-Na; Liu, Bing; Xiao, Jian; Li, Jin-Shan Journal of Organometallic Chemistry, 2006, vol. 691, #6 p. 1282-1287
- (B-2): Badar, Y. et al., Journal of the Chemical Society, 1965, p. 1412-1418
- (B-3): Hsieh, Jen-Chieh; Cheng, Chien-Hong Chemical Communications (Cambridge, United Kingdom), 2008, #26 p. 2992-2994
- (B-4): Japanese Unexamined Patent Application, Publication No. H5-238990
- (B-5): Bacon, R. G. R.; Bankhead, R. Journal of the Chemical Society, 1963, p. 839-845
- (B-6), (B-8), (B-11), (B-12): Macromolecules 2010, vol 43, p 2832-2839
- (B-9), (B-10): Polymer Journal 2008, vol. 40, No. 7, p 645-650: Journal of Polymer Science: Part A, Polymer Chemistry, Vol 46, p 4949-4958

Comparative Example 1

As shown in Table 1, 10 parts of the resin (A-1), 1 part of a crosslinking agent (the following compound (b-1)), and 0.5 parts of a thermal acid generating agent (diphenyliodonium trifluoromethane sulfonate (D-1)) were dissolved in 90 parts of a solvent (propylene glycol monomethyl ether acetate (C-1)). This solution was filtered through a membrane filter having a pore size of 0.1 μm to prepare a resin composition for forming a resist underlayer film of Comparative Example 1.

Comparative Examples 2 to 4

Each resin composition for forming a resist underlayer film of Comparative Examples 2 to 4 was prepared in a similar manner to Comparative Example 1 except that each component of the type and the amount blended shown in Table 1 was used.

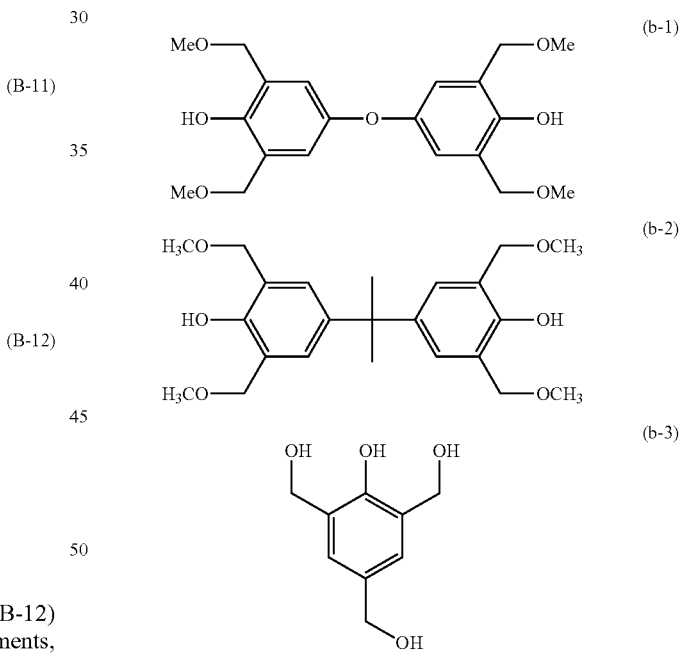

(b-1)

(b-2)

(b-3)

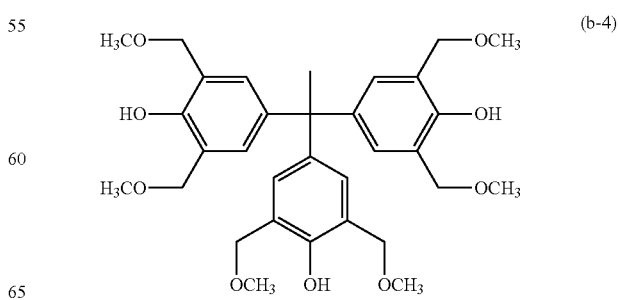

(b-4)

TABLE 1

| | Resin (A) | | Crosslinking agent (B) | | Solvent (C) | | Thermal acid generating agent (D) | |
|---|---|---|---|---|---|---|---|---|
| | type | amount blended (parts by mass) | type | amount blended (parts by mass) | type | amount blended (parts by mass) | type | amount blended (parts by mass) |
| Example 1 | A-1 | 10 | B-1 | 1 | C-1 | 90 | D-1 | 0.5 |
| Example 2 | A-1 | 10 | B-2 | 1 | C-1 | 90 | D-1 | 0.5 |
| Example 3 | A-1 | 10 | B-3 | 1 | C-1 | 90 | D-1 | 0.5 |
| Example 4 | A-1 | 10 | B-4 | 1 | C-1 | 90 | D-1 | 0.5 |
| Example 5 | A-1 | 10 | B-5 | 1 | C-1 | 90 | D-1 | 0.5 |
| Example 6 | A-2 | 10 | B-6 | 1 | C-1 | 90 | D-1 | 0.5 |
| Example 7 | A-3 | 10 | B-7 | 1 | C-1 | 90 | D-1 | 0.5 |
| Example 8 | A-1 | 10 | B-8 | 1 | C-1 | 90 | D-1 | 0.5 |
| Example 9 | A-1 | 10 | B-9 | 1 | C-1 | 90 | D-1 | 0.5 |
| Example 10 | A-2 | 10 | B-10 | 1 | C-1 | 90 | D-1 | 0.5 |
| Example 11 | A-3 | 10 | B-11 | 1 | C-1 | 90 | D-1 | 0.5 |
| Example 12 | A-3 | 10 | B-12 | 1 | C-1 | 90 | D-1 | 0.5 |
| Comparative Example 1 | A-1 | 10 | b-1 | 1 | C-1 | 90 | D-1 | 0.5 |
| Comparative Example 2 | A-2 | 10 | b-2 | 1 | C-1 | 90 | D-1 | 0.5 |
| Comparative Example 3 | A-1 | 10 | b-3 | 1 | C-1 | 90 | D-1 | 0.5 |
| Comparative Example 4 | A-3 | 10 | b-4 | 1 | C-1 | 90 | D-1 | 0.5 |

(3) Evaluations of Resin Composition for Forming a Resist Underlayer Film

The following evaluations of each resin composition for forming a resist underlayer film of Examples 1 to 12 and Comparative Examples 1 to 4 were made. The results are shown in Table 2.

<Resist Shape>

On a silicon wafer having a diameter of 12 inch a silicon-oxide film was deposited to give a thickness of 0.3 μm by a CVD method. Next, each composition for forming a resist underlayer film was spin coated, and heated on a hot plate at an oxygen concentration of 20% by volume at 180° C. for 60 sec, followed by subsequent heating at 350° C. for 120 sec to provide a resist underlayer film having a film thickness of 0.25 μm. Next, after an intermediate layer composition solution for three-layer resist process (NFC SOG508, manufactured by JSR Corporation) was spin coated on the resist underlayer film, heated at 200° C. for 60 sec and subsequently heated at 300° C. for 60 sec to provide an intermediate layer having a film thickness of 0.04 μm. Next, a resist composition was spin coated on the intermediate layer and prebaked at 100° C. for 60 sec to provide a resist film having a film thickness of 0.1 μm. It is to be noted that the resist composition used was a commercially available product (ARX3038JN, manufactured by JSR Corporation).

Next, exposure was carried out using an ArF Immersion Scanner (numerical aperture of the lens: 1.30; and exposure wavelength: 193 nm, manufactured by NIKON Corporation) through a mask for an optimum exposure time. Subsequently, after post-baking was carried out at 100° C. for 60 sec, the resist film was developed using a 2.38% by mass aqueous tetramethyl ammonium hydroxide solution. Thereafter, washing with water and drying were conducted to form a positive type resist pattern.

Then, the resist film having the positive type resist pattern thus formed was observed by a scanning electron microscope and evaluated according to the following criteria (in Table 2, designated as "Resist shape"). When the observed pattern configuration was rectangular, the evaluation was made as "A" (favorable), whereas when the observed pattern configuration had a shape other than rectangular (for example, T-top, scum, etc.), the evaluation was made as "B" (unfavorable).

<Flexural Resistance>

On a silicon wafer having a diameter of 12 inch a silicon-oxide film was deposited to give a thickness of 0.3 μm by a CVD method. Next, each composition for forming a resist underlayer film was spin coated, and heated on a hot plate at an oxygen concentration of 20% by volume at 180° C. for 60 sec, followed by subsequent heating at 350° C. for 120 sec to provide a resist underlayer film having a film thickness of 0.25 μm. Next, after an intermediate layer composition solution for three-layer resist process (NFC SOG508, manufactured by JSR Corporation) was spin coated on the resist underlayer film, heated at 200° C. for 60 sec and subsequently heated at 300° C. for 60 sec to provide an intermediate layer having a film thickness of 0.04 μm. Next, the resist composition described above was spin coated on the intermediate layer and prebaked at 100° C. for 60 sec to provide a resist film having a film thickness of 0.1 μm.

Next, exposure was carried out using an ArF Immersion Scanner (numerical aperture of the lens: 1.30; and exposure wavelength: 193 nm, manufactured by NIKON Corporation) through a mask for an optimum exposure time. Subsequently, after post-baking was carried out at 100° C. for 60 sec, the resist film was developed using a 2.38% by mass aqueous tetramethyl ammonium hydroxide solution. Thereafter, washing with water and drying were conducted to form a positive type resist pattern. Subsequently, the intermediate layer was subjected to a dry etching treatment by a carbon tetrafluoride gas with the resist film having the pattern thus formed as a mask, using a reactive ion etching type etching apparatus (manufactured by Telius SCCM, Tokyo Electron Limited). When the intermediate layer situated below the openings of the resist film disappeared the etching treatment was stopped, whereby the resist pattern was transferred to the intermediate layer.

Next, a dry etching treatment was carried out with the intermediate layer to which the resist pattern had been transferred, as a mask, using the aforementioned etching apparatus by a gas mixture of oxygen and nitrogen. When the resist underlayer film situated below the openings of the intermediate layer disappeared, the etching treatment was stopped, whereby the pattern of the intermediate layer was transferred to the resist underlayer film. Subsequently, a dry etching treatment was carried out with the resist underlayer film to which the pattern of the intermediate layer had been transferred as a mask, using the aforementioned etching apparatus by a gas mixture of carbon tetrafluoride and argon. When the siliconoxide film situated below the openings of the resist underlayer film was removed by 0.1 μm, the etching treatment was stopped.

Then, of the resist underlayer film pattern remained on the substrate, the shape of a line-and-space pattern in which linear patterns are arranged at even intervals was observed by SEM (scanning electron microscope). In the line-and-space pattern, 100 linear patterns are arranged at even intervals with the intervals repeated have a fixed width of 84 nm, which are collectively regarded as one set. On one substrate are provided 21 pattern sets having varying pattern width. The pattern width varies from 30 nm to 50 nm being different by 1 nm with each other. The pattern width as herein referred to means a width of one line of the linear patterns arranged at even intervals formed from the resist underlayer film. In the patterns designed similarly on the substrate, the pattern having each pattern width was observed by the SEM at arbitrary five positions, the results of the observation were defined for the evaluation of the flexural resistance. In this process, evaluation of the flexural resistance was made: as "A" (favorable) when the patterns of the resist underlayer film all vertically stood; as "B" (somewhat favorable) when one curved portion was included; and as "C" (unfavorable) when two or more curved portions were included.

<Etching Resistance>

On a silicon wafer having a diameter of 8 inch, each of the resin compositions for forming a resist underlayer film of the aforementioned Examples and Comparative Examples was spin coated, and then heated on a hot plate at an oxygen concentration of 20% by volume at 180° C. for 60 sec, and subsequently at 350° C. for 120 sec to provide a resist underlayer film having a film thickness of 0.25 μm. This resist underlayer film was subjected to an etching process using an etching apparatus "EXAM" (manufactured by SHINKO SEIKI Co. Ltd.,), with $CF_4/Ar/O_2$ ($CF_4$: 40 mL/min, Ar: 20 mL/min, $O_2$: 5 mL/min; pressure: 20 Pa; RF power: 200 W; process time: 40 sec; temperature: 15° C.).

Then, the etching rate was determined by measuring the film thicknesses before and after the etching process, and the etching resistance was evaluated according to the following criteria.

"A": the etching rate being no greater than 120 nm/min; and

"B": the etching rate being greater than 120 nm/min

<Element Composition>

On a silicon wafer having a diameter of 8 inch, each of the resin compositions for forming a resist underlayer film of the aforementioned Examples and Comparative Examples was spin coated, and then heated on a hot plate at an oxygen concentration of 20% by volume at 180° C. for 60 sec, and subsequently at 350° C. for 120 sec to provide a resist underlayer film having a film thickness of 0.25 μm. With regard to this resist underlayer film, the value of each element equivalent to the mass was calculated using Micro CORDER (i.e., an apparatus for carbon-hydrogen-nitrogen simultaneous quantitative analyzer) "JM10" (manufactured by J-SCIENCE LAB Co., Ltd.).

Then, the number of atoms of each element included in the film was calculated according to the formula of: (mass equivalent value (% by mass) of each element)/(amount of atoms (g/mol) of each element). Thereafter, the hydrogen content (atom %) after completing the dehydrogenation reaction was determined according to the formula of: (number of hydrogen atoms in the film)/(total number of atoms in the film).

It is to be noted that the hydrogen content before the dehydrogenation reaction was determined using a resist underlayer film provided by spin coating each resin composition for forming a resist underlayer film of Examples and Comparative Examples on a silicon wafer having a diameter of 8 inch, followed by heating on a hot plate at an oxygen concentration of 20% by volume at 200° C. for 60 sec.

TABLE 2

| | Resist shape | Flexural resistance | Etching resistance | Hydrogen content (atom %) | |
|---|---|---|---|---|---|
| | | | | before dehydrogenation | after dehydrogenation |
| Example 1 | A | A | A | 38 | 23 |
| Example 2 | A | A | A | 40 | 25 |
| Example 3 | A | A | A | 41 | 26 |
| Example 4 | A | A | A | 41 | 26 |
| Example 5 | A | A | A | 39 | 24 |
| Example 6 | A | A | A | 38 | 23 |
| Example 7 | A | A | A | 39 | 24 |
| Example 8 | A | A | A | 42 | 23 |
| Example 9 | A | A | A | 39 | 23 |
| Example 10 | A | A | A | 39 | 22 |
| Example 11 | A | A | A | 41 | 23 |
| Example 12 | A | A | A | 39 | 22 |
| Comparative Example 1 | B | B | B | 40 | 25 |
| Comparative Example 2 | B | B | B | 41 | 25 |
| Comparative Example 3 | B | C | B | 40 | 25 |
| Comparative Example 4 | B | B | B | 40 | 25 |

As shown in Table 2, according to each resin composition for forming a resist underlayer film of Examples 1 to 12, it was ascertained that the resist formed on the upper layer has favorable pattern configuration, along with having superior pattern transfer performances and etching resistance, and is capable of forming a resist underlayer film while inhibiting bending also in fine pattern transfer.

According to the resin composition for forming a resist underlayer film of the embodiment of the present invention, the resist formed on the upper layer has favorable pattern configuration, is superior in etching resistance, and can form a resist underlayer film having an underlayer film pattern less likely to be bent when a substrate to be processed is etched. Therefore, the resin composition can be extremely suitably used in microfabrication in lithography processes. In particular, the resist formed on an upper layer has favorable pattern configuration, and will have accurate pattern transfer performances and favorable etching selectivity in dry etching processes, accompanied by less overetching of the resist underlayer film, thereby enabling the resist pattern to be transferred to the substrate to be processed with good reproducibility and fidelity. In addition, since bending of the underlayer film pattern can be prevented when a substrate to be processed is etched, improvement of yields in microfabrication in lithography processes, particularly in manufacture of highly integrated circuit elements can be expected.

Furthermore, the pattern-forming method of the embodiment of the present invention in which such a resin composition for forming a resist underlayer film is used is extremely useful as a lithography process, in particular a process for manufacturing highly integrated circuit elements.

Obviously, numerous modifications and variations of the present invention are possible in light of the above teachings. It is therefore to be understood that within the scope of the appended claims, the invention may be practiced otherwise than as specifically described herein.

What is claimed is:

1. A resin composition for forming a resist underlayer film, comprising:
   a resin that comprises an aromatic ring; and
   a crosslinking agent represented by formula (B-1):

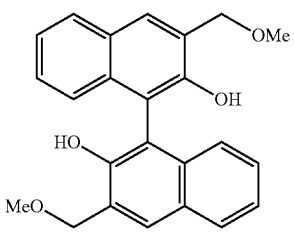

(B-1)

wherein Me is a methyl group.

2. The resin composition according to claim 1, wherein the resin is a novolak resin, a resol resin, an acenaphthylene resin, a styrene resin, a polyarylene resin, or a combination thereof.

3. The resin composition according to claim 1, further comprising a solvent.

4. A resist underlayer film formed from the resin composition according to claim 1.

5. A resist underlayer film-forming method comprising:
   providing a coating film using the resin composition according to claim 1; and
   heating the coating film.

6. A pattern-forming method comprising:
   providing a resist underlayer film on an upper face side of a substrate using the resin composition according to claim 1;
   providing a resist film on an upper face side of the resist underlayer film using a resist composition;
   exposing the resist film;
   developing the exposed resist film to form a resist pattern; and
   sequentially dry etching the resist underlayer film and the substrate using the resist pattern as a mask.

7. A resin composition for forming a resist underlayer film, comprising:
   a resin that comprises an aromatic ring; and
   a crosslinking agent represented by formula (B-2):

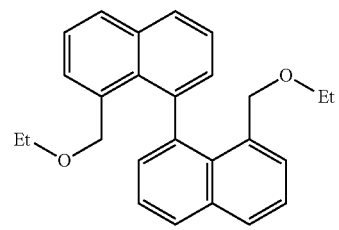

(B-2)

wherein Et is an ethyl group.

8. The resin composition according to claim 7, wherein the resin is a novolak resin, a resol resin, an acenaphthylene resin, a styrene resin, a polyarylene resin, or a combination thereof.

9. The resin composition according to claim 7, further comprising a solvent.

10. A resist underlayer film formed from the resin composition according to claim 7.

11. A resist underlayer film-forming method comprising:
    providing a coating film using the resin composition according to claim 7; and
    heating the coating film.

12. A pattern-forming method comprising:
    providing a resist underlayer film on an upper face side of a substrate using the resin composition according to claim 9;
    providing a resist film on an upper face side of the resist underlayer film using a resist composition;
    exposing the resist film;
    developing the exposed resist film to form a resist pattern; and
    sequentially dry etching the resist underlayer film and the substrate using the resist pattern as a mask.

13. A resin composition for forming a resist underlayer film, comprising:
    a resin that comprises an aromatic ring; and
    a crosslinking agent represented by formula (B-5):

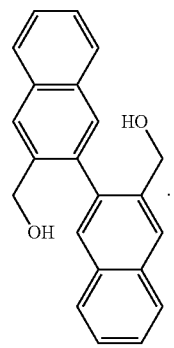

(B-5)

14. The resin composition according to claim 13, wherein the resin is a novolak resin, a resol resin, an acenaphthylene resin, a styrene resin, a polyarylene resin, or a combination thereof.

15. The resin composition according to claim 13, further comprising a solvent.

16. A resist underlayer film formed from the resin composition according to claim 13.

17. A resist underlayer film-forming method comprising:
providing a coating film using the resin composition according to claim 13; and
heating the coating film.

18. A pattern-forming method comprising:
providing a resist underlayer film on an upper face side of a substrate using the resin composition according to claim 13;
providing a resist film on an upper face side of the resist underlayer film using a resist composition;
exposing the resist film;
developing the exposed resist film to form a resist pattern; and
sequentially dry etching the resist underlayer film and the substrate using the resist pattern as a mask.

19. A resin composition for forming a resist underlayer film, comprising:
a resin that comprises an aromatic ring; and
a crosslinking agent represented by formula (B-6):

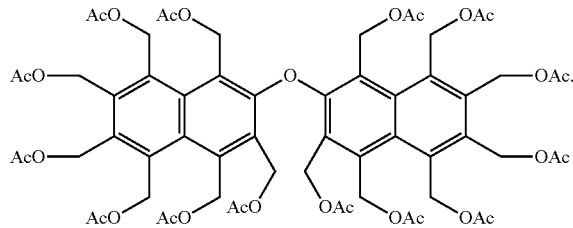

(B-6)

20. The resin composition according to claim 19, wherein the resin is a novolak resin, a resol resin, an acenaphthylene resin, a styrene resin, a polyarylene resin, or a combination thereof.

21. The resin composition according to claim 19, further comprising a solvent.

22. A resist underlayer film formed from the resin composition according to claim 19.

23. A resist underlayer film-forming method comprising:
providing a coating film using the resin composition according to claim 19; and
heating the coating film.

24. A pattern-forming method comprising:
providing a resist underlayer film on an upper face side of a substrate using the resin composition according to claim 19;
providing a resist film on an upper face side of the resist underlayer film using a resist composition;
exposing the resist film;
developing the exposed resist film to form a resist pattern; and
sequentially dry etching the resist underlayer film and the substrate using the resist pattern as a mask.

* * * * *